United States Patent
Seki et al.

(10) Patent No.: US 11,824,074 B2
(45) Date of Patent: *Nov. 21, 2023

(54) IMAGING ELEMENT AND IMAGING APPARATUS INCLUDING INCIDENT LIGHT ATTENUATING SECTION BETWEEN COLOR FILTERS

(71) Applicant: SONY SEMICONDUCTOR SOLUTIONS CORPORATION, Kanagawa (JP)

(72) Inventors: Yuichi Seki, Kumamoto (JP); Syunsuke Kameda, Kumamoto (JP); Akimasa Kotake, Kumamoto (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/900,648

(22) Filed: Aug. 31, 2022

(65) Prior Publication Data

US 2022/0415946 A1 Dec. 29, 2022

Related U.S. Application Data

(63) Continuation of application No. 16/606,318, filed as application No. PCT/JP2018/015911 on Apr. 17, 2018, now Pat. No. 11,482,551.

(30) Foreign Application Priority Data

Apr. 25, 2017 (JP) .................................. 2017-085973

(51) Int. Cl.
*H01L 27/146* (2006.01)
*G02B 5/00* (2006.01)
(Continued)

(52) U.S. Cl.
CPC ........ *H01L 27/14623* (2013.01); *G02B 5/003* (2013.01); *H01L 27/14621* (2013.01);
(Continued)

(58) Field of Classification Search
CPC ......... H01L 27/14623; H01L 27/14621; H01L 27/14627; G02B 5/003; G02B 5/20;
(Continued)

(56) References Cited

U.S. PATENT DOCUMENTS 11,482,551 B2 * 10/2022 Seki ....................... H04N 25/62
2006/0205107 A1 9/2006 Inaba et al.
(Continued)

FOREIGN PATENT DOCUMENTS

CN 1830087 A 9/2006
CN 101888489 A 11/2010
(Continued)

OTHER PUBLICATIONS

International Search Report and Written Opinion for International (PCT) Patent Application No. PCT/JP2018/015911, dated Jul. 17, 2018, 6 pages.
(Continued)

*Primary Examiner* — Gevell V Selby
(74) *Attorney, Agent, or Firm* — Sheridan Ross PC

(57) ABSTRACT

Manufacture of an imaging element in which light entering a pixel without being transmitted through a color filter arranged in the pixel is attenuated is simplified. An imaging element includes a pixel and an incident light attenuating section. The pixel includes a color filter through which light having a predetermined wavelength of light from a subject is transmitted, and a photoelectric conversion section generating charges responding to the light transmitted through the color filter. The incident light attenuating section is arranged between the subject and the color filter, and attenu-
(Continued)

ates the light entering the photoelectric conversion section without being transmitted through the color filter arranged in the pixel.

20 Claims, 7 Drawing Sheets

(51) Int. Cl.
  *H04N 23/12* (2023.01)
  *H04N 23/84* (2023.01)
  *H04N 25/70* (2023.01)
  *G02B 5/20* (2006.01)

(52) U.S. Cl.
  CPC ............. *H04N 23/12* (2023.01); *H04N 23/84* (2023.01); *H04N 25/70* (2023.01); *G02B 5/20* (2013.01); *H01L 27/14627* (2013.01)

(58) Field of Classification Search
  CPC .. G02B 5/201; G02B 27/0018; G02B 3/0056; H04N 23/12; H04N 23/84; H04N 25/70; H04N 25/134; H04N 25/62

See application file for complete search history.

(56) References Cited

U.S. PATENT DOCUMENTS

| | | |
|---|---|---|
| 2007/0058055 A1 | 3/2007 | Yamaguchi et al. |
| 2012/0147208 A1 | 6/2012 | Otsuka et al. |
| 2012/0235266 A1 | 9/2012 | Ootsuka |
| 2014/0054662 A1 | 2/2014 | Yanagita et al. |
| 2014/0367821 A1 | 12/2014 | Ootsuka |
| 2017/0201726 A1 | 7/2017 | Yorikado |
| 2017/0287960 A1 | 10/2017 | Masuda et al. |
| 2019/0027518 A1 | 1/2019 | Miyata et al. |
| 2022/0059593 A1 | 2/2022 | Seki et al. |

FOREIGN PATENT DOCUMENTS

| | | |
|---|---|---|
| JP | 2002-261261 | 9/2002 |
| JP | 2010-034426 | 2/2010 |
| JP | 2012-191136 | 10/2012 |
| WO | WO 2005/013369 | 2/2005 |

OTHER PUBLICATIONS

Official Action for U.S. Appl. No. 16/606,318, dated Jan. 20, 2022, 7 pages.
Official Action for U.S. Appl. No. 16/606,318, dated Jun. 7, 2022, 12 pages.
Notice of Allowance for U.S. Appl. No. 16/606,318, dated Jun. 23, 2022, 8 pages.

* cited by examiner

IMAGING ELEMENT AND IMAGING APPARATUS INCLUDING INCIDENT LIGHT ATTENUATING SECTION BETWEEN COLOR FILTERS

CROSS REFERENCE TO RELATED APPLICATIONS

This application is a continuation of U.S. patent application Ser. No. 16/606,318 filed Oct. 18, 2019, which This application is a national stage application under 35 U.S.C. 371 and claims the benefit of PCT Application No. PCT/JP2018/015911 having an international filing date of 17 Apr. 2018, which designated the United States, which PCT application claimed the benefit of Japanese Patent Application No. 2017-085973 filed 25 Apr. 2017, the entire disclosures of each of which are incorporated herein by reference.

TECHNICAL FIELD

The present technology relates to an imaging element. Particularly, the present technology relates to an imaging element and an imaging apparatus in which pixels each having a color filter are two-dimensionally arranged.

BACKGROUND ART

In the related art, an imaging element in which pixels generating respective pixel signals each responding to light having a predetermined wavelength by arranging color filters are arranged and which generates color image signals has been used. For example, an imaging element has been used in which pixels each having a color filter through which any of red light, green light or blue light is transmitted and a light receiving element generating charges responding to the light transmitted through the color filter arranged are arranged in a two-dimensional lattice shape on the basis of predetermined rules. In this case, the respective image signals corresponding to the red light, the green light and the blue light are generated, and full-color image data can be acquired.

When light having a wavelength different from the wavelength corresponding to the color filter arranged in the pixel enters the light receiving element of the pixel of interest in such an imaging element, color mixing from which an image signal having a plurality of colors mixed with one another is generated is caused. For example, in a case where light from a subject obliquely enters the imaging element to reach the light receiving element through an adjacent pixel or a boundary portion between the pixels, the light enters the light receiving element of the pixel of interest without passing through the color filter arranged in the own pixel. In such a case, light in a plurality of colors are mixed into the light receiving element of the pixel, and the color mixing is caused. As a result, color purity of the image signal generated by the imaging element is reduced, and an image quality is also reduced.

In addition, in a camera in which phase difference pixels for detecting an image plane phase difference are arranged in an imaging element and which performs autofocus on the basis of a detected phase difference, light is mixed from an adjacent pixel into a phase difference detection pixel, resulting in that a detection accuracy of the image plane phase difference is reduced. This is because the mixed light turns into a noise causing an error.

In view of this, an imaging element is used in which, in order to prevent such mixing of light from an adjacent pixel or the like, a light shielding film is arranged between the color filters of the adjacent pixels (e.g., refer to PTL 1).

CITATION LIST

Patent Literature

[PTL 1]
Japanese Patent Laid-Open No. 2010-34426

SUMMARY

Technical Problem

The related art described above is made in such a way that the light entering from the adjacent pixel is shielded by the light shielding film arranged between the color filters. However, the related art described above involves a problem that, since the light shielding film is arranged in the same layer as that of the color filter, roughness resulting from the light shielding film is generated when the color filter is formed, and formation of the color filter becomes difficult.

The present technology has been made in the light of the problem described above, and an object thereof is to simplify manufacture of an imaging element in which light entering a pixel having a color filter arranged therein is attenuated without causing the light to be transmitted through the color filter arranged in the pixel of interest.

Solution to Problem

A first aspect of the present technology is an imaging element including a pixel including a color filter through which light having a predetermined wavelength of light from a subject is transmitted and a photoelectric conversion section generating charges responding to the light transmitted through the color filter, and an incident light attenuating section arranged between the subject and the color filter and attenuating the light entering the photoelectric conversion section without being transmitted through the color filter arranged in the pixel.

In addition, a second aspect of the present technology is an imaging apparatus including a pixel including a color filter through which light having a predetermined wavelength of light from a subject is transmitted and a photoelectric conversion section generating charges responding to the light transmitted through the color filter, an incident light attenuating section arranged between the subject and the color filter, and attenuating the light entering the photoelectric conversion section without being transmitted through the color filter arranged in the pixel, and a processing section processing a pixel signal as a signal responding to the generated charges.

The incident light attenuating section is arranged, and the light entering the photoelectric conversion section without being transmitted through the color filter is attenuated, enabling only light having a wavelength selected by a color filter to enter the photoelectric conversion section of the pixel in which the color filter is arranged. In this case, the incident light attenuating section is arranged between the subject and the color filter. In other words, in a light receiving surface as a surface receiving the light from the subject in the imaging element, the incident light attenuating section is arranged outside the color filter. Accordingly, provided is an effect that, after the color filter is formed in a manufacturing process of the imaging element, the incident light attenuating section is formed.

Advantageous Effect of Invention

According to the present technology, when the imaging element is manufactured, the color filter can be formed without being affected by the incident light attenuating section. Consequently, there is offered an excellent effect that the manufacture of the imaging element in which the light entering the pixel without being transmitted through the color filter arranged in the pixel is attenuated can be simplified.

DESCRIPTION OF EMBODIMENTS

Figure 1:
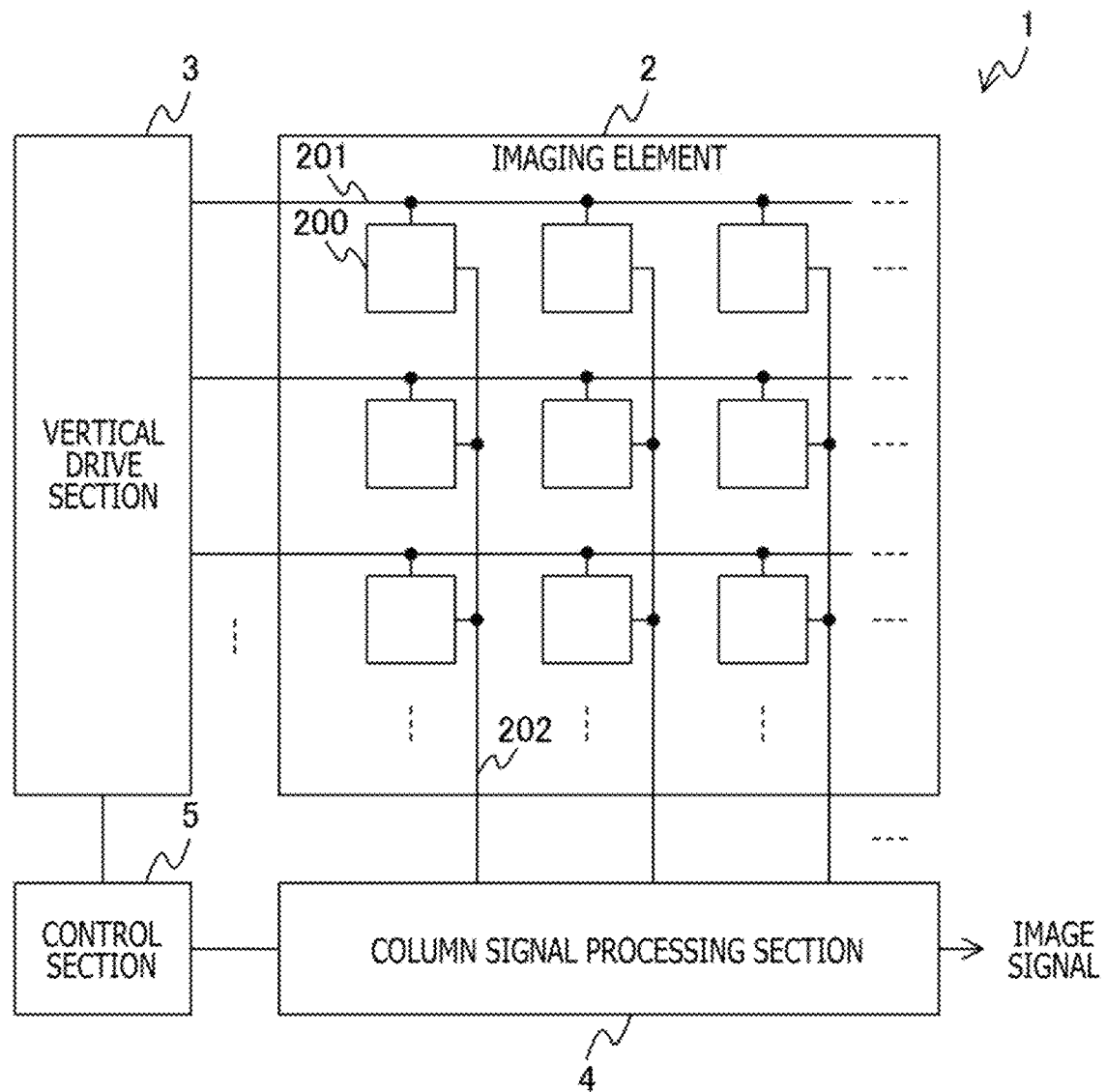
FIG. 1 is a block diagram depicting an example of a configuration of an imaging apparatus in a first embodiment of the present technology.

Next, modes for carrying out the present technology (hereinafter, referred to as embodiments) will be described with reference to the drawings. In the following drawings, the same or similar elements are denoted by the same or similar reference numerals. It should be noted that the drawings are schematic depictions and a scale of each dimension of the sections or the like does not necessarily agree with the actual one. In addition, different drawings may include portions using different scales and dimensional relations, as a matter of course. In addition, embodiments will be described in accordance with the following order.
1. First Embodiment
2. Second Embodiment
3. Third Embodiment 1. First Embodiment

[Configuration of Imaging Apparatus]
FIG. 1 is a block diagram depicting an example of a configuration of an imaging apparatus in a first embodiment of the first technology. The imaging apparatus 1 depicted in the figure includes an imaging element 2, a vertical drive section 3, a column signal processing section 4, and a control section 5.

The imaging element 2 is configured by arranging pixels 200 in a two-dimensional lattice shape. The pixel 200 generates an image signal responding to light from a subject. The pixel 200 includes a photoelectric conversion section (a photoelectric conversion section 242 which will be described later) generating charges responding to the incident light, and a pixel circuit generating an image signal based on the charges generated by the photoelectric conversion section. Details of a configuration of the pixel 200 will be described later.

In addition, signal lines 201 and 202 are arranged in an XY matrix in the imaging element 2, and are wired for a plurality of pixels 200. Here, the signal line 201 is a signal line through which a control signal for controlling the pixel circuit of the pixel 200 is transmitted. The signal line 201 is arranged for each row of the pixels 200 arranged in the imaging element 2, and is wired in common to a plurality of pixels 200 arranged in one row. In addition, the signal line 202 is a signal line through which the pixel signal generated by the pixel circuit of the pixel 200 is transmitted. The signal line 202 is arranged for each column of the pixels 200 arranged in the imaging element 2, and is wired in common to a plurality of pixels 200 arranged in one column.

The vertical drive section 3 generates the control signal for the pixel 200, and outputs the control signal through the signal line 201. The vertical drive section 3 generates a different control signal for each row of the pixels 200 arranged in the imaging element 2, and outputs the control signals.

The column signal processing section 4 processes the image signal generated by the pixel 200, and outputs the image signal after being processed. Analog-to-digital conversion processing converting an analog image signal generated by the pixel 200 into a digital image signal, for example, corresponds to the processing in the column signal processing section 4. The image signal outputted from the column signal processing section 4 corresponds to the output signal from the imaging apparatus 1. It is to be noted that the column signal processing section 4 is an example of a processing section described in the appended claims.

The control section 5 controls the vertical drive section 3 and the column signal processing section 4. The control section 5 generates and outputs the respective control signals for the vertical drive section 3 and the column signal processing section 4, thereby performing the control of those sections.

Figure 2:
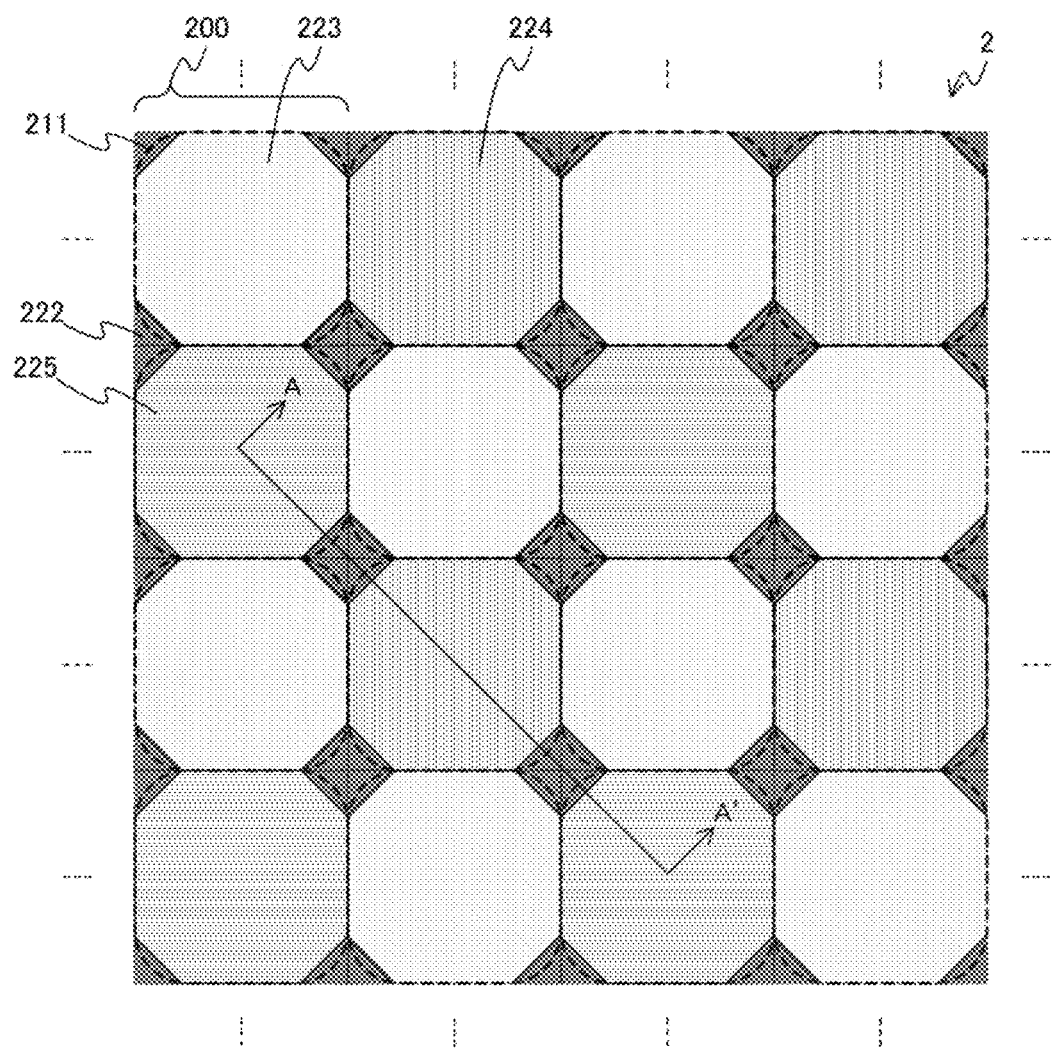
FIG. 2 is a view depicting an example of a configuration of an imaging element in the first embodiment of the present technology.

[Configuration of Imaging Element]
FIG. 2 is a view depicting an example of a configuration of the imaging element in the first embodiment of the present technology. The figure is a view representing a situation of a light receiving surface receiving light from a subject in the imaging element 2. In the figure, a rectangle indicated by a broken line represents a partition of the adjacent pixels 200. As represented in the figure, a plurality of pixels 200 is arranged in a two-dimensional lattice shape on the light receiving surface of the imaging element 2.

In the figure, the pixel 200 includes an on-chip lens 211, and any of color filters 223 to 225. The on-chip lens 211 is arranged for each pixel 200 and condenses the light from the subject on the photoelectric conversion section which will be described later.

Each of the color filters 223 to 225 is an optical filter which is arranged between the on-chip lens 211 and the photoelectric conversion section, and transmits the light having a predetermined wavelength of the light from the subject. The light from the subject enters the color filters 223 to 225 depicted in the figure through the on-chip lens 211. Here, the wavelengths of the light which is transmitted through the color filters 223 to 225 are different from one another. For example, the color filters 223 to 225 can serve as respective color filters which transmit green light, blue light and red light. The pixel 200 generates an image signal responding to the light having the wavelength selected by the arranged color filters 223 to 225. It is to be noted that the respective pixels 200 in which the respective color filters through which the green light, the blue light and the red light are arranged are referred to as a green pixel, a blue pixel, and a red pixel. It is to be noted that, as represented in the figure, an array method in which the green pixels are arranged in a checkered shape, and the blue pixel and the red pixel are arranged between the green pixels is referred to as the Bayer arrangement.

In addition, the imaging element 2 includes an incident light attenuating section 222. The incident light attenuating section 222 attenuates the light entering the photoelectric conversion section in the pixel without being transmitted through corresponding one of the color filters 223 to 225 arranged in the pixels 200. In addition, the incident light attenuating section 222 is arranged between the subject and the color filters 223 to 225. In the imaging element 2 depicted in the figure, the incident light attenuating sections 222 are arranged between the on-chip lenses 211 and the color filters 223 to 225. In addition, the incident light attenuating section 222 is arranged close to a boundary among a plurality of pixels 200. In the figure, the incident light attenuating section 222 is arranged in a region of corners of the adjacent four pixels 200.

A region in which the incident light attenuating section 222 is arranged is a region in which the on-chip lens 211 is not arranged on the color filter 223 or the like, i.e., a region including a gap between the on-chip lenses 211. The gap between the on-chip lenses 211 is referred to as an invalid region. In a case where the incident light attenuating section 222 is not arranged in the imaging element 2, the light which is not condensed by the on-chip lens 211 enters the inside of the pixel 200 through the invalid region. As will be described later, since the photoelectric conversion section is arranged at a central portion of the pixel 200, the light passing through the invalid region does not enter the photoelectric conversion section. However, the light which enters the pixel obliquely with respect to the light receiving surface reaches the photoelectric conversion section through the invalid region and becomes light which is mixed into the photoelectric conversion section without passing through the color filter 223 or the like arranged in the corresponding pixel 200. Then, the incident light attenuating section 222 is arranged to attenuate the light entering from the invalid region, resulting in that the light mixed into the photoelectric conversion section can be reduced. Incidentally, even when a configuration is adopted in which the on-chip lens 211 is not arranged in the pixel 200, the incident light attenuating section 222 is arranged close to the boundary among the plurality of pixels 200, resulting in that the light obliquely entering from the adjacent pixel 200 can be prevented from being mixed into the photoelectric conversion section.

As represented in the figure, the incident light attenuating section 222 is formed in a quadrilateral shape in light receiving surface view. The incident light attenuating section 222 can, for example, be formed of a film which is obtained by dispersing a material having a light shielding property in a resin. Examples of the material having the light shielding property can include carbon block, titanium black, or an oxide of a metal (e.g., a magnetite type triiron tetraoxide ($Fe_3O_4$)) to be used. Moreover, a resist having photosensitivity is used as the resin described above, resulting in that the incident light attenuating section 222 can be formed by photolithography similarly to formation of the color filter 223 or the like.

In addition, in a case where color mixing resulting from light having a specific wavelength is prevented, the color filter attenuating the light having the specific wavelength can also be used as the incident light attenuating section 222. For example, in a case where the color filter transmitting the red light is used as the incident light attenuating section 222, the color mixing resulting from the entering of the green light and the blue light can be prevented. In contrast, since the red light can be transmitted through that color filter, the sensitivity for the red light can be enhanced. Moreover, in addition to the primary color filter, a complementary color filter can also be used as such an incident light attenuating section 222.

[Configuration of Color Filter]

Figure 3:
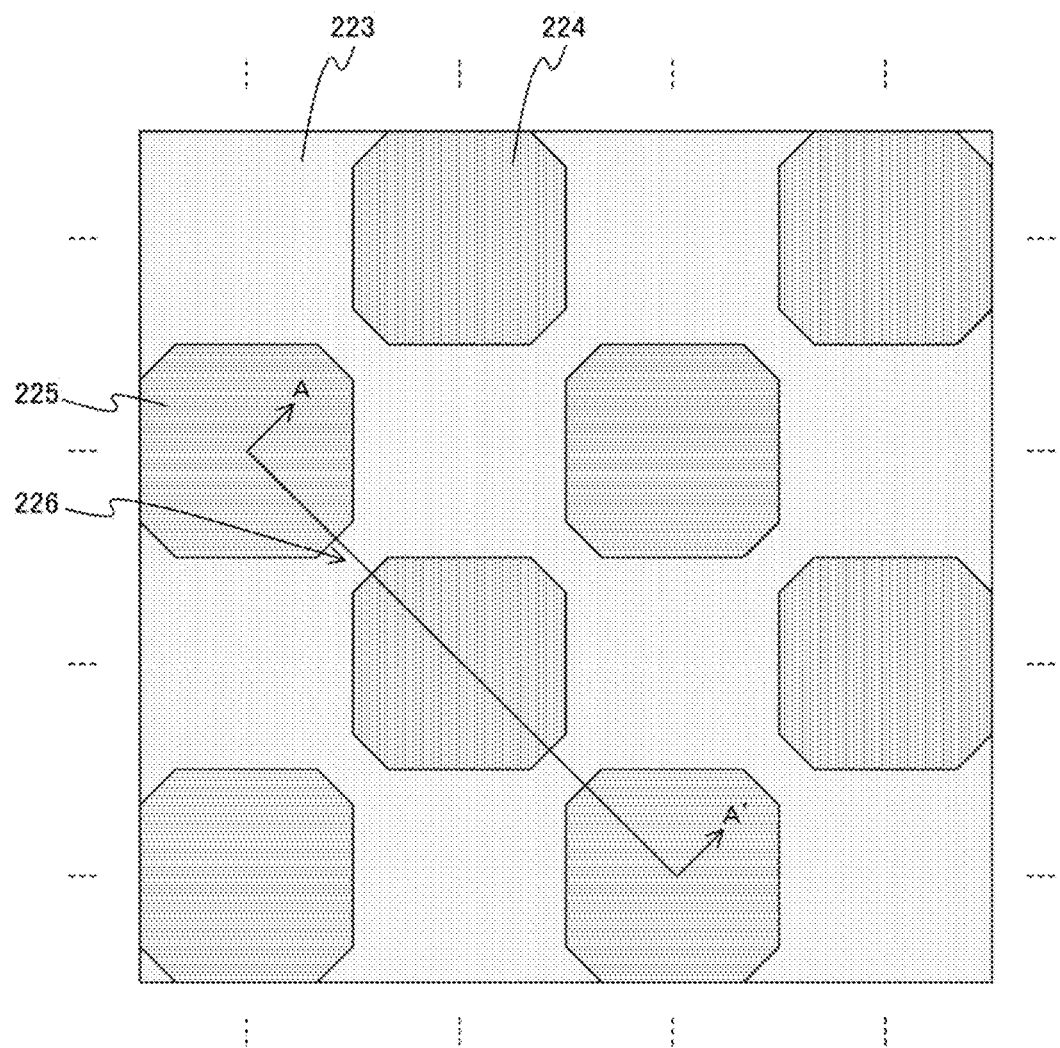
FIG. 3 is a view depicting an example of a configuration of a color filter in the first embodiment of the present technology.

FIG. 3 is a view depicting an example of a configuration of the color filter in the first embodiment of the present technology. The figure is a view representing a configuration of the color filters 223 to 225 of the imaging element 2 described with reference to FIG. 2. The figure depicts an example in which octagonal-shaped color filters 224 and 225 each are arranged in part of the color filter 223. In this case, a shape is obtained in which the adjacent color filters 223 are connected to each other. In this case, a configuration is obtained in which the color filters 226 each corresponding to the green light are arranged in regions of corners of the adjacent four pixels 200 as connecting portions.

Such a color filter can, for example, be formed as follows. First, after a resin constituting the color filter 223 is coated and cured, the respective regions in which the color filters 224 and 225 are to be arranged are removed by etching. Thereafter, the color filters 224 and 225 are formed in the respective regions thus removed. As a result, the color filters 226 can be arranged in the regions of the corners of the adjacent four pixels 200. In such a manner, in the imaging element 2 having the Bayer arrangement configuration, the configuration is adopted in which the color filters 223 each corresponding to the green light are connected to each other, resulting in that generation of trouble due to separation of the color filter can be reduced.

It is to be noted that the shape of the color filter is not limited to that of this example. For example, the color filter 226 may be omitted, and the color filters 223 to 225 may be formed to be substantially the same shape (rectangular shape) as that of the pixel 200.

[Configuration of Pixel]

Figure 4:
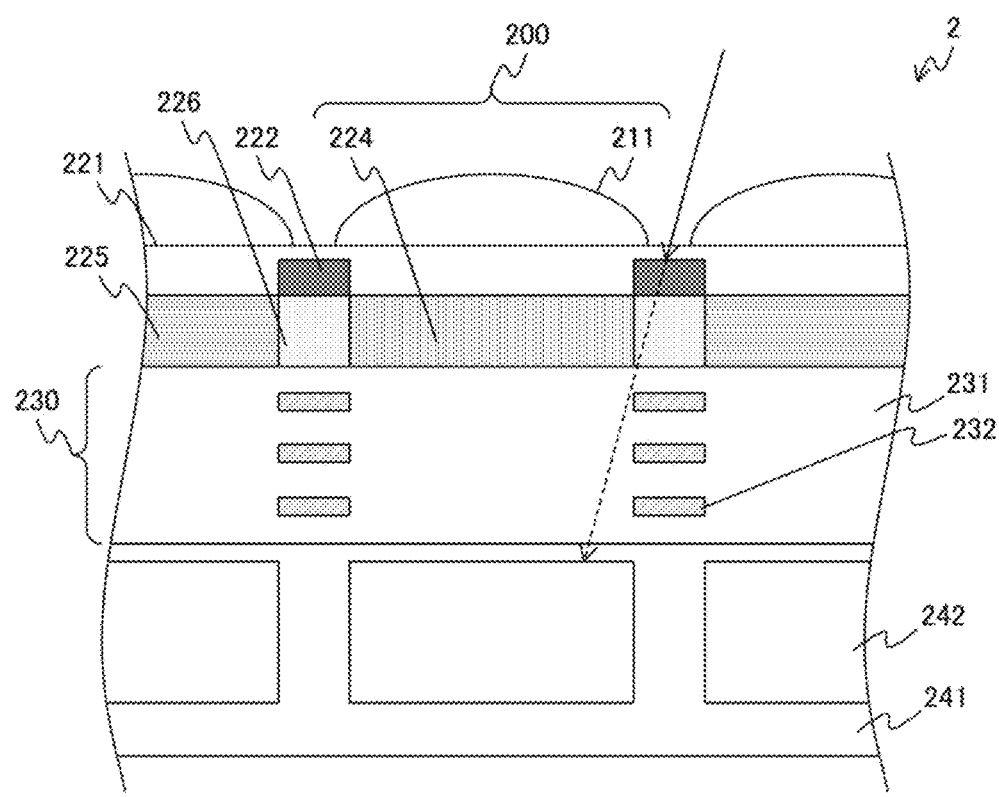
FIG. 4 is a cross-sectional view depicting an example of a configuration of a pixel in the first embodiment of the present technology.

FIG. 4 is a cross-sectional view depicting an example of a configuration of the pixel in the first embodiment of the present technology. The figure is a schematic cross-sectional view of the pixel 200 taken along line A-A' described in FIGS. 2 and 3. The pixel 200 depicted in the figure further includes a planarization film 221, a wiring region 230, and a semiconductor substrate 241 in addition to the on-chip lens 211, the incident light attenuating section 222, and the color filters 224 to 226.

The semiconductor substrate 241 has a semiconductor element (not depicted) constituting the photoelectric conversion section described with reference to FIG. 1 (the photoelectric conversion section 242 in the figure) and the pixel circuit formed therein. A semiconductor substrate, for example, including a P-type semiconductor can be used as the semiconductor substrate 241. In this case, an N-type semiconductor region formed within the semiconductor substrate 241 can be used as the photoelectric conversion section 242. When a PN junction portion formed in an interface between the semiconductor substrate 241 and the photoelectric conversion section 242 is illuminated with the light from the subject, the charges responding to the incident light are generated by the photoelectric conversion and are held in the photoelectric conversion section 242. A pixel signal based on the held charges is generated by the pixel circuit and is outputted as a pixel signal of the pixel 200.

The wiring region 230 is a region in which the signal lines 201 and 202 described with reference to FIG. 1 are formed. The wiring region 230 includes a wiring layer 232 and an insulating layer 231. The wiring layer 232 is made of a metal or the like and constitutes the signal line 201 or the like. As represented in the figure, the wiring layer 232 can be formed as a multi-layer interconnection. The insulating layer 231 insulates the wiring layers 232 from each other. A silicon dioxide ($SiO_2$) or a BPSG (Boron Phosphorus Silicon Glass) which transmits the light can be used for the insulating layer 231. Thus, the imaging element 2 in which the color filter 224 and the on-chip lens 211 are formed on the wiring region 230 and light enters the photoelectric conversion section 242 through the wiring region 230 is referred to as a front-illuminated imaging element. In the front-illuminated imaging element, the wiring layer 232 is arranged in the invalid region.

The planarization film 221 is arranged on a lower layer of the on-chip lens 211, and planarizes a surface of the imaging element 2 before the on-chip lens 211 is formed. In the imaging element 2, the color filters 223 to 226, the incident light attenuating section 222, the planarization film 221, and the on-chip lens 211 are formed in order on the wiring region 230 in such a manner.

An arrow in the figure represents the light obliquely entering a gap region between the on-chip lenses 211, and a solid line represents a situation in which this light is attenuated by the incident light attenuating section 222 to be shielded. In such a manner, mixing of the obliquely entering light can be prevented by the incident light attenuating section 222. Meanwhile, a dotted line represents an example of a case where there is no incident light attenuating section 222. In this case, the light obliquely entering the gap region between the on-chip lenses 211 enters the photoelectric conversion section 242 through the color filter 226 instead of the color filter 224. Since the color filters 224 and 226 are different in wavelength of the light transmitted through the color filters 224 and 226, the color mixing is generated in the pixel 200 of the interest.

A description will now be given with respect to a method of forming the incident light attenuating section 222. After the color filter 224 and the like are formed, the incident light attenuating section 222 can be formed by photolithography. Specifically, the resist in which the material having the light shielding property described with reference to FIG. 2 is dispersed is coated onto the color filter 224 and the like, and exposure and development are then performed. As a result, the color filter 224 and the like, and the incident light attenuating section 222 are layered in order, and the incident light attenuating section 222 can be formed on an upper surface of the color filter 224 and the like.

In contrast to this, in a case where a configuration is adopted in which the incident light attenuating section 222 is arranged on the lower layer of the color filter 224 and the like, the incident light attenuating section 222 is formed on the wiring region 230, and next, the color filter 224 and the like are formed on the incident light attenuating section 222. In this case, a resin serving as a material for the color filter is coated to a surface in which a level difference due to the incident light attenuating section 222 is present in the imaging element 2, resulting in that unevenness is generated in a film thickness of the color filter 224 and the like. In order to enhance the ability to remove the light to be mixed, a film thickness of the incident light attenuating section 222 needs to be increased. In such a case, the unevenness of the film thickness of the color filter is further increased. In addition, since the incident light attenuating section 222 is opaque, alignment in the photolithography manufacturing process when the color filter 224 and the like are formed becomes difficult to be performed, thereby also causing a problem that a dimensional accuracy of the color filter 224 and the like is reduced.

In addition, even in a case where the color filter 224 and the like and the incident light attenuating section 222 are arranged in the same layer, the mixing of the light can be prevented. Specifically, a configuration is adopted in which the incident light attenuating section 222 is arranged in the region of the color filter 226 in FIG. 4, thereby enabling the mixing of the light to be prevented. In this case, however, the incident light attenuating section 222 needs to be arranged in the gap defined between the color filters 224 and the like in the region of the corners of the four adjacent pixels 200. This leads to formation of the incident light attenuating section 222 in the narrow region, which is difficult.

Thus, the incident light attenuating section 222 is arranged on the upper surface of the color filter 224 and the like, resulting in that an influence of the incident light attenuating section 222 when the color filter is formed can be removed, and prevention of generation of the unevenness in film thickness of the color filter, and enhancement of an dimensional accuracy can be promoted. In other words, the color filter can be formed in the processes similar to those in a case where the incident light attenuating section 222 is not arranged. In addition, since the color filter 224 and the like can be formed without being affected by the incident light attenuating section 222, the film thickness of the incident light attenuating section 222 can be easily adjusted.

It is to be noted that the configuration of the imaging element 2 is not limited to this example. For example, a configuration of a back-illuminated imaging element can also be adopted in which in FIG. 4, the on-chip lens 211, the planarization film 221, and the color filter 224 are formed on a surface different from the surface on which the wiring region 230 is formed in the semiconductor substrate 241. Moreover, a configuration can also be adopted in which the planarization film and the like are further arranged between the incident light attenuating section 222, and the color filter 224 and the like.

As has been described so far, according to the first embodiment of the present technology, the incident light attenuating section 222 is arranged between the subject and the color filter, resulting in that the color filter can be easily formed, and manufacture of the imaging element can be simplified.

2. Second Embodiment

The imaging element 2 of the first embodiment described above uses the incident light attenuating section 222 which has the quadrilateral shape in light receiving surface view. In contrast to this configuration, an imaging element 2 of a second embodiment of the present technology is different from the imaging element 2 of the first embodiment in that the imaging element 2 uses a circular incident light attenuating section 222.

[Configuration of Imaging Element]

Figure 5:
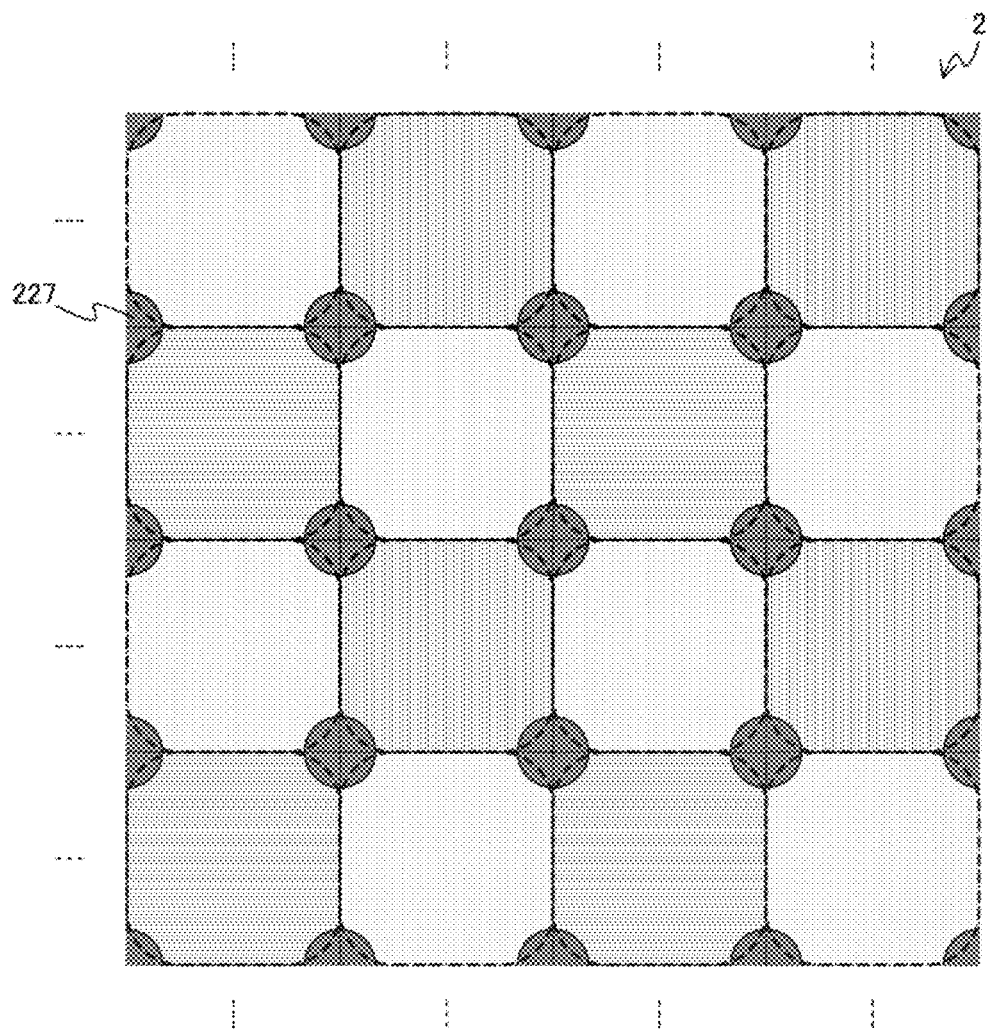
FIG. 5 is a view depicting an example of a configuration of an imaging element in a second embodiment of the present technology.

FIG. 5 is a view depicting an example of a configuration of the imaging element in the second embodiment of the present technology. The imaging element 2 depicted in the figure is different from the imaging element 2 described with reference to FIG. 2 in that the imaging element 2 of the figure includes an incident light attenuating section 227 instead of the incident light attenuating section 222.

As represented in the figure, the incident light attenuating section 227 is formed in a circular shape in light receiving surface view. For this reason, the exposure and the development in the photolithography process when the incident light attenuating section 227 is formed can be easily performed. This effect is remarkable in a case where the size of the pixel 200 is reduced.

Since the configuration of the imaging apparatus 1 other than the above configuration is similar to the imaging apparatus 1 of the first embodiment of the present disclosure, a description thereof is omitted.

As has been described above, according to the second embodiment of the present technology, the incident light attenuating section 227 is formed in the circular shape in light receiving surface view, thereby enabling the formation of the incident light attenuating section 227 to be simplified.

3. Third Embodiment

The incident light attenuating section 222 in the first embodiment described above is arranged in the region of the corners of the adjacent four pixels 200. In contrast to this configuration, an incident light attenuating section of a third embodiment of the present technology is different from the case of the first embodiment in that the incident light attenuating section of the third embodiment is further arranged in adjacent regions in sides of the pixels 200.

[Configuration of Imaging Element]

Figure 6:
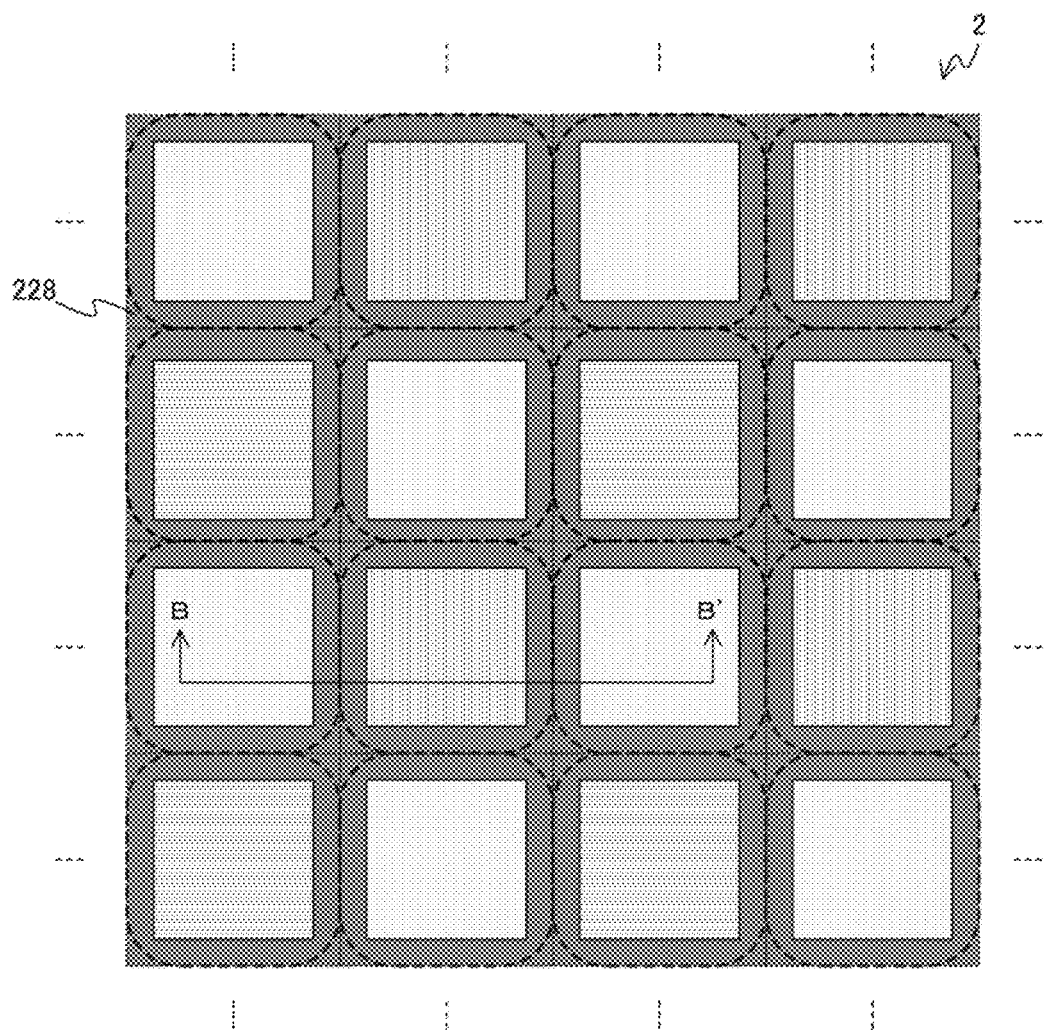
FIG. 6 is a view depicting an example of a configuration of an imaging element in a third embodiment of the present technology.

FIG. 6 is a view depicting an example of a configuration of the imaging element in the third embodiment of the present technology. The imaging element 2 depicted in the figure is different from the imaging element 2 described with reference to FIG. 2 in that the imaging element 2 of the figure includes an incident light attenuating section 228 instead of the incident light attenuating section 222.

The incident light attenuating section 228 of the figure is arranged in the region in which the pixels 200 are adjacent to each other. Specifically, the incident light attenuating section 228 is arranged close to the corners and the sides of the adjacent pixels 200. In the figure, the incident light attenuating section 228 is formed in a lattice shape on the light receiving surface of the imaging element 2.

Consequently, mixing of light from the regions close to the corners and the sides of the adjacent pixels 200 can be prevented.

[Configuration of Pixel]

Figure 7:
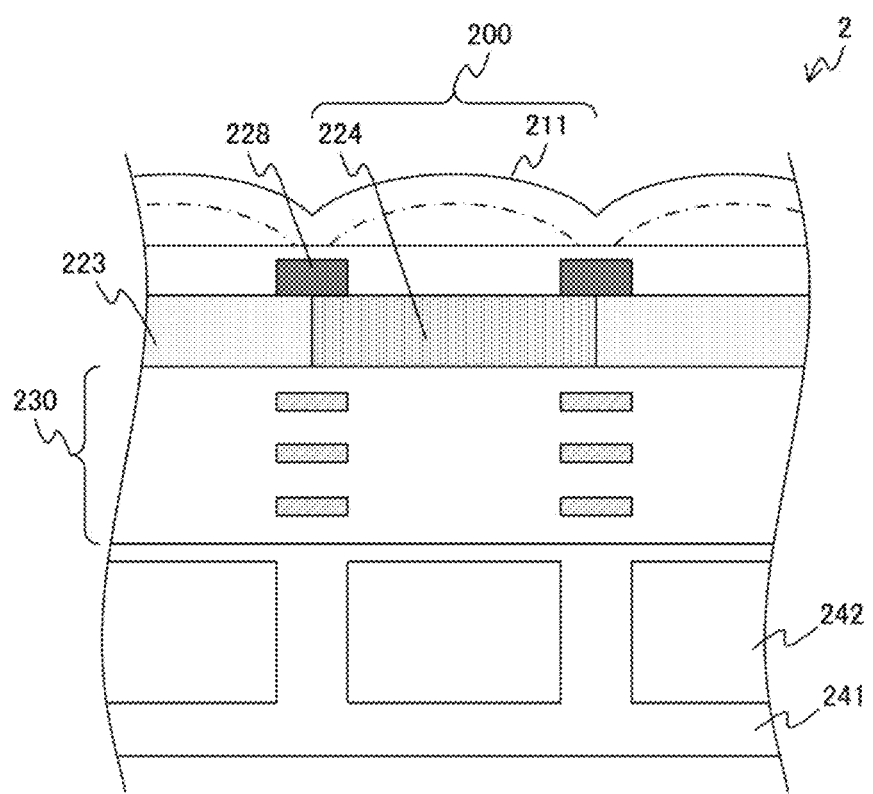
FIG. 7 is a cross-sectional view depicting an example of a configuration of a pixel in the third embodiment of the present technology.

FIG. 7 is a cross-sectional view depicting an example of a configuration of a pixel in the third embodiment of the present technology. The figure is a schematic cross-sectional view of the pixel 200 taken along line B-B' described in FIG. 6. Since the figure is the view representing the region in which the pixels 200 are adjacent to each other on their sides, the color filter 226 is not arranged. In addition, the adjacent on-chip lenses 211 are formed in a shape in which end portions thereof are connected to each other. The reason for this is because the invalid region described above is reduced. The incident light attenuating section 228 is arranged in the region of the sides of the adjacent pixels 200, resulting in that the light entering from connecting sections of the on-chip lenses 211 or the like to be mixed into the photoelectric conversion section 242 can be reduced.

It is to be noted that a one-dot chain line in the figure represents another example of the on-chip lens 211. In this example, the adjacent on-chip lenses 211 are separately arranged. The reason for this is because the condensing accuracy of the incident light is enhanced by preventing a fluctuation in curvature in the end portion of the on-chip lens 211. Accordingly, a relatively wide invalid region is formed in the region of the sides of the adjacent pixels 200. In such a case, the effect described above becomes more remarkable.

Since the configuration of the imaging apparatus 1 other than the above configuration is similar to the imaging apparatus 1 of the first embodiment of the present disclosure, a description thereof is omitted.

As has been described so far, according to the third embodiment of the present technology, the incident light attenuating section 228 is formed close to the corners and the sides in adjacent pixels 200, thereby enabling the mixing of the light to be further reduced.

Lastly, the descriptions of the above embodiments are examples of the present technology, and the present technology is not limited to the above embodiments. Accordingly, it is a matter of course that various modifications can be made according to design and the like as long as an embodiment other than the above embodiments does not depart from the technical idea of the present technology.

It is to be noted that the present technology can also adopt the following configurations.

(1) An imaging element including:
   a pixel including a color filter through which light having a predetermined wavelength of light from a subject is transmitted and a photoelectric conversion section generating charges responding to the light transmitted through the color filter; and
   an incident light attenuating section arranged between the subject and the color filter and attenuating the light entering the photoelectric conversion section without being transmitted through the color filter arranged in the pixel.

(2) The imaging element according to (1) described above, in which
   a plurality of the pixels is arranged, and
   the incident light attenuating section is arranged close to a boundary of the plurality of the pixels.

(3) The imaging element according to (2) described above, in which
   the incident light attenuating section is arranged in a region of corners of the adjacent four pixels.

(4) The imaging element according to (2) described above, in which
   the incident light attenuating section is arranged in a region of sides of the adjacent two pixels.

(5) The imaging element according to any one of (1) to (4) described above, in which
   the pixel further includes an on-chip lens condensing the light from the subject and causing the condensed light to enter the color filter, and
   the incident light attenuating section is arranged between the on-chip lens and the color filter.

(6) An imaging apparatus including:
   a pixel including a color filter through which light having a predetermined wavelength of light from a subject is transmitted and a photoelectric conversion section generating charges responding to the light transmitted through the color filter;

an incident light attenuating section arranged between the subject and the color filter, and attenuating the light entering the photoelectric conversion section without being transmitted through the color filter arranged in the pixel; and a processing section processing a pixel signal as a signal responding to the generated charges.

REFERENCE SIGNS LIST

1 ... Imaging apparatus
2 ... Imaging element
3 ... Vertical drive section
4 ... Column signal processing section
5 ... Control section
200 ... Pixel
211 ... On-chip lens
221 ... Planarization film
222, 227, 228 ... Incident light attenuating section
223 to 226 ... Color filter
230 ... Wiring region
231 ... Insulating layer
232 ... Wiring layer
241 ... Semiconductor substrate
242 ... Photoelectric conversion section

The invention claimed is:

1. An imaging element, comprising:
a first pixel including:
   a color filter through which light having a predetermined wavelength of light from a subject is transmitted;
   a photoelectric conversion section generating charges responding to the light transmitted through the color filter;
   an incident light attenuating section arranged between the subject and the color filter;
   wherein the incident light attenuating section attenuates the light entering the photoelectric conversion section without being transmitted through the color filter arranged in the pixel; and
   a first on-chip lens of a plurality of on-chip lenses,
   wherein end portions of the plurality of on-chip lenses are not connected to each other.

2. The imaging element according to claim 1, further comprising:
a second pixel disposed adjacent to the first pixel,
wherein the second pixel includes a second on-chip lens of the plurality of on-chip lenses, and
wherein the incident light attenuating section overlaps a region between the first on-chip lens and the second on-chip lens.

3. The imaging element according to claim 1, wherein the incident light attenuating section is provided within a planarization film.

4. The imaging element according to claim 1, further comprising an adjacent color filter arranged at an overlapping end portion of the pixel.

5. The imaging element according to claim 4, wherein the adjacent color filter is provided beneath the incident light attenuating section.

6. The imaging element according to claim 1, further comprising a wiring layer provided between the photoelectric conversion section and the color filter.

7. The imaging element according to claim 1, wherein the incident light attenuating section has a quadrilateral shape.

8. An imaging apparatus comprising:
a first pixel including:
   a color filter through which light having a predetermined wavelength of light from a subject is transmitted;
   a photoelectric conversion section generating charges responding to the light transmitted through the color filter;
   an incident light attenuating section arranged between the subject and the color filter, and attenuating the light entering the photoelectric conversion section without being transmitted through the color filter arranged in the pixel; and
   a first on-chip lens of a plurality of on-chip lenses,
   wherein end portions of the plurality of on-chip lenses are not connected to each other; and
   a processing section processing a pixel signal as a signal responding to the generated charges.

9. The imaging apparatus according to claim 8, further comprising:
a second pixel disposed adjacent to the first pixel,
wherein the second pixel includes a second on-chip lens of the plurality of on-chip lenses, and
wherein the incident light attenuating section overlaps a region between the first on-chip lens and the second on-chip lens.

10. The imaging apparatus according to claim 8, wherein the incident light attenuating section is provided within a planarization film.

11. The imaging apparatus according to claim 8, further comprising an adjacent color filter arranged at an overlapping end portion of the pixel.

12. The imaging apparatus according to claim 11, wherein the adjacent color filter is provided beneath the incident light attenuating section.

13. The imaging apparatus according to claim 8, further comprising a wiring layer provided between the photoelectric conversion section and the color filter.

14. The imaging apparatus according to claim 8, wherein the incident light attenuating section has a quadrilateral shape.

15. An imaging element, comprising:
a first pixel including:
   a color filter through which light having a predetermined wavelength of light is transmitted;
   a photoelectric conversion section generating charges responding to the light transmitted through the color filter;
   a first on-chip lens of a plurality of on-chip lens,
   wherein end portions of the plurality of on-chip lens are not connected to each other; and
   an incident light attenuating section arranged between the first on-chip lens and the color filter,
   wherein the incident light attenuating section attenuates the light entering the photoelectric conversion section without being transmitted through the color filter arranged in the pixel.

16. The imaging element according to claim 15, further comprising:
a second pixel disposed adjacent to the first pixel,
wherein the second pixel includes a second on-chip lens of the plurality of on-chip lenses, and
wherein the incident light attenuating section overlaps a region between the first on-chip lens and the second on-chip lens.

17. The imaging element according to claim 15, wherein the incident light attenuating section is provided within a planarization film.

18. The imaging element according to claim 15, further comprising an adjacent color filter arranged at an overlapping end portion of the pixel.

19. The imaging element according to claim 18, wherein the adjacent color filter is provided beneath the incident light attenuating section.

20. The imaging element according to claim 15, further comprising a wiring layer provided between the photoelectric conversion section and the color filter.

\* \* \* \* \*